(12) United States Patent
Yokokawa

(10) Patent No.: US 10,347,525 B2
(45) Date of Patent: Jul. 9, 2019

(54) METHOD FOR PRODUCING BONDED SOI WAFER

(71) Applicant: SHIN-ETSU HANDOTAI CO., LTD., Tokyo (JP)

(72) Inventor: Isao Yokokawa, Takasaki (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 0 days.

(21) Appl. No.: 15/767,174

(22) PCT Filed: Aug. 29, 2016

(86) PCT No.: PCT/JP2016/003916
§ 371 (c)(1),
(2) Date: Apr. 10, 2018

(87) PCT Pub. No.: WO2017/072994
PCT Pub. Date: May 4, 2017

(65) Prior Publication Data
US 2019/0074213 A1 Mar. 7, 2019

(30) Foreign Application Priority Data
Oct. 28, 2015 (JP) ................................ 2015-211730

(51) Int. Cl.
*H01L 21/02* (2006.01)
*H01L 21/762* (2006.01)
(Continued)

(52) U.S. Cl.
CPC ........ *H01L 21/76254* (2013.01); *H01L 21/02* (2013.01); *H01L 21/265* (2013.01);
(Continued)

(58) Field of Classification Search
None
See application file for complete search history.

(56) References Cited

U.S. PATENT DOCUMENTS

| 5,863,829 A | 1/1999 | Nakayoshi et al. |
| 2003/0181001 A1* | 9/2003 | Aga ................ H01L 21/76254 438/200 |

(Continued)

FOREIGN PATENT DOCUMENTS

| JP | H09-64321 A | 3/1997 |
| JP | 2006-270039 A | 10/2006 |

(Continued)

OTHER PUBLICATIONS

May 1, 2018 International Preliminary Report on Patentability issued in International Patent Application No. PCT/JP2016/003916.
(Continued)

*Primary Examiner* — Bradley Smith
(74) *Attorney, Agent, or Firm* — Oliff PLC

(57) ABSTRACT

A method for producing a bonded SOI wafer, by ion implantation delamination to fabricate a bonded SOI wafer having a BOX layer and a SOI layer on a base wafer. After performing flattening heat treatment in an argon gas-containing atmosphere, sacrificial oxidation treatment adjusts the film thickness of the SOI layer, wherein the film thickness of the BOX layer is 500 nm or more. A sacrificial oxide film is formed so the relationship between the film thickness of the SOI layer on the sacrificial oxidation treatment is performed. The film thickness of the sacrificial oxide film formed by the sacrificial oxidation treatment satisfies $0.9d > t > 0.45d$. A method for producing a bonded SOI wafer can prevent the generation of particles from the outermost peripheral part, which is the form of an overhang by flattening heat treatment, of a SOI layer in the production of a bonded SOI wafer.

8 Claims, 3 Drawing Sheets

(51) Int. Cl.
    *H01L 21/265*   (2006.01)
    *H01L 21/324*   (2006.01)
    *H01L 27/12*    (2006.01)

(52) U.S. Cl.
    CPC ...... *H01L 21/324* (2013.01); *H01L 21/76243* (2013.01); *H01L 27/12* (2013.01)

(56) References Cited

U.S. PATENT DOCUMENTS

| | | |
|---|---|---|
| 2008/0315349 A1 | 12/2008 | Takei et al. |
| 2009/0170285 A1 | 7/2009 | Soeta et al. |
| 2010/0129993 A1 | 5/2010 | Yokokawa et al. |
| 2012/0135584 A1 | 5/2012 | Yokokawa et al. |
| 2018/0144975 A1* | 5/2018 | Yokokawa ............... H01L 21/02 |
| 2019/0035639 A1* | 1/2019 | Wakabayashi .......... H01L 21/26 |

FOREIGN PATENT DOCUMENTS

| | | |
|---|---|---|
| JP | 2007-317988 A | 12/2007 |
| JP | 2009-027124 A | 2/2009 |
| JP | 2012-129347 A | 7/2012 |
| WO | 03-009386 A1 | 1/2003 |
| WO | 2011/027545 A1 | 3/2011 |

OTHER PUBLICATIONS

May 15, 2018 Office Action issued in Japanese Patent Application No. 2015-211730.
Nov. 1, 2016 International Search Report issued in International Patent Application No. PCT/JP2016/003916.

* cited by examiner

METHOD FOR PRODUCING BONDED SOI WAFER

TECHNICAL FIELD

The present invention relates to a method for producing a bonded SOI wafer and, in particular, relates to a method for producing a SOI wafer by using an ion implantation delamination method.

BACKGROUND ART

As a method for producing a Silicon on Insulator (SOT) wafer, in particular, a method for producing a thin-film SOI wafer that can enhance the performance of a leading-edge integrated circuit, a method for producing a SOI wafer by delaminating an ion implanted wafer after bonding (an ion implantation delamination method: the technology also called SmartCut® process) has attracted attention.

This ion implantation delamination method is the technology of producing a bonded SOI wafer by forming an oxide film on at least one of two silicon wafers and implanting gas ions such as hydrogen ions or rare gas ions from the upper surface of one silicon wafer (a bond wafer) and thereby forming an ion implanted layer (also called a microbubble layer or an encapsulated layer) in the wafer, then bringing the implanted surface into intimate contact with the other silicon wafer (a base wafer) with the oxide film placed therebetween, and then delaminating the one wafer (the bond wafer) in the form of a thin film by using the microbubble layer as a cleavage plane by performing heat treatment (delamination heat treatment). Moreover, there is a method of achieving firm bonding by performing heat treatment (bonding heat treatment) on the SOI wafer subjected to delamination (refer to Patent Document 1).

At this stage, the cleavage plane (the delaminating plane) is the surface of a SOI layer, and a SOI wafer whose SOI film thickness is small and has a high degree of uniformity is obtained with relative ease. However, a damaged layer caused by ion implantation is present on the surface of the SOI wafer subjected to delamination, and the surface roughness is greater than that of a mirror surface of a normal silicon wafer. Thus, in the ion implantation delamination method, it is necessary to remove such a damaged layer and surface roughness.

As one of the methods for removing such a surface roughness or a damaged layer of the SOI layer surface, there is an annealing technique of performing high-temperature heat treatment in an argon-containing atmosphere. This annealing technique makes it possible to maintain high film thickness uniformity of the SOI layer obtained by the ion implantation delamination method while flattening the SOI layer surface (Patent Documents 1 and 2).

CITATION LIST

Patent Literature

Patent Document 1: WO 2003/009386
Patent Document 2: WO 2011/027545

DISCLOSURE OF INVENTION

Problem to be Solved by the Invention

If a bonded SOI wafer having a BOX layer (a buried oxide film layer) and a SOI layer on a base wafer is fabricated by the ion implantation delamination method and the delaminated surface is flattened by heat treatment in an argon gas-containing atmosphere (hereinafter also referred to simply as Ar annealing), etching of the SOI/BOX interface and the BOX/base wafer interface progresses and the foundation BOX layer disappears at the outermost peripheral part of the SOI layer, which sometimes causes the outermost peripheral part of the SOT layer to be left in the form of an overhang shortly after Ar annealing.

As a result, in subsequent SOI wafer production process (such as cleaning and heat treatment), device production process, and so forth, an overhang portion easily exfoliates, which undesirably results in the generation of particles.

The present invention has been made in view of the problem described above and an object thereof is to prevent, in the production of a bonded SOI wafer, the generation of particles from the outermost peripheral part, which is left in the form of an overhang by flattening heat treatment in an argon gas-containing atmosphere, of a SOI layer.

Means for Solving Problem

To attain the object, the present invention provides a method for producing a bonded SOI wafer, by forming an ion implanted layer by implanting at least one type of gas ion of a hydrogen ion and a rare gas ion from a surface of a bond wafer formed of a silicon single crystal and, after bonding together the ion implanted surface of the bond wafer and a surface of a base wafer formed of a silicon single crystal with a silicon oxide film placed therebetween, delaminating the bond wafer at the ion implanted layer to fabricate a bonded SOI wafer having a BOX layer and a SOT layer on a base wafer and, after performing flattening heat treatment on the bonded SOI wafer in an argon gas-containing atmosphere, sacrificial oxidation treatment that adjusts the film thickness of the SOI layer is performed, wherein the film thickness of the BOX layer in the bonded SOI wafer fabricated by the delamination is set so as to be 500 nm or more, and a sacrificial oxide film is formed in such a way that the relationship between the film thickness (t) of the SOI layer on which the sacrificial oxidation treatment is to be performed and the film thickness (d) of the sacrificial oxide film which is formed by the sacrificial oxidation treatment satisfies $0.9d > t > 0.45d$.

As described above, after performing flattening heat treatment on a bonded SOI wafer with a BOX layer whose film thickness is 500 nm or more in an argon gas-containing atmosphere, by forming a sacrificial oxide film in such a way that the relationship between the film thickness (t) of a SOI layer just before sacrificial oxidation treatment and the film thickness (d) of the sacrificial oxide film which is formed by the sacrificial oxidation treatment satisfies $0.9d > t > 0.45d$, the overhang-shaped outermost peripheral part of the SOI layer completely changes into the sacrificial oxide film, which makes it possible to perform complete removal by subsequent oxide film removal. Thus, it is possible to prevent the generation of particles from the outermost peripheral part, which is left in the form of an overhang after Ar annealing, of the SOI layer.

Moreover, in this case, it is preferable that the argon gas-containing atmosphere is 100% Ar gas.

If flattening heat treatment is performed in a 100% Ar gas atmosphere as described above, the outermost peripheral part of the SOI layer is left in the form of an overhang more noticeably, which makes it possible to use the method for producing a bonded SOI wafer according to the present invention more effectively.

Furthermore, in the present invention, it is preferable that, by forming a silicon oxide film which is 500 nm or more on the base wafer and, after bonding together the base wafer on which the silicon oxide film is formed and the ion implanted surface of the bond wafer, delaminating the bond wafer at the ion implanted layer, the bonded SOI wafer with the BOX layer whose film thickness is 500 nm or more is fabricated.

If such a thick oxide film is formed on a bond wafer on which ion implantation for delamination is performed, an ion implantation apparatus that can perform high-voltage ion implantation is necessary. For this reason, it is preferable that a silicon oxide film which is 500 nm or more and becomes a BOX layer is formed on the base wafer's side. Moreover, if a silicon oxide film which is 500 nm or more is formed on the base wafer's side as described above, since exfoliation at a thermal oxidation interface (the interface between a BOX layer and a base wafer) occurs notably, the outermost peripheral part of the SOI layer is left in the form of an overhang more noticeably. This makes it possible to apply the method for producing a bonded SOI wafer according to the present invention more effectively.

In addition, in the present invention, an epitaxial layer may also be formed on the surface of the SOI layer subjected to the sacrificial oxidation treatment.

When a bonded SOI wafer is produced by the ion implantation delamination method as in the present invention, since the film thickness of a SOI layer depends on the magnitude of an acceleration voltage of an ion implantation apparatus, the SOI layer is usually limited to a thin-film SOI layer which is thinner than 1 μm. For this reason, in order to produce a bonded SOI wafer having a SOI layer whose film thickness is a few μm or more and film thickness uniformity is high, it is necessary to additionally form an epitaxial layer on the surface of the thin-film SOI layer fabricated by the ion implantation delamination method. Also in such a case, with the present invention, it is possible to prevent the generation of particles from the outermost peripheral part of the SOI layer and also suppress the generation of defects at the time of formation of the epitaxial layer.

Effect of the Invention

According to the present invention, by adjusting a sacrificial oxide film thickness in sacrificial oxidation treatment after Ar annealing so that the overhang-shaped outermost peripheral part of a SOI layer completely changes into a sacrificial oxide film, it is possible to prevent the generation of particles from the outermost peripheral part, which is left in the form of an overhang after Ar annealing, of the SOT layer.

BEST MODE FOR CARRYING OUT THE INVENTION

Figure 2:
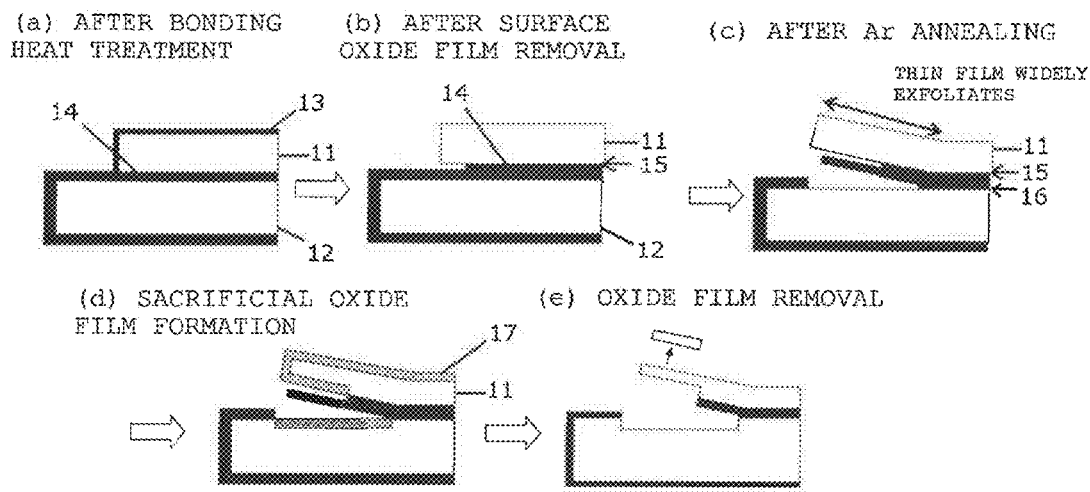
FIG. 2 is an explanatory diagram of a mechanism by which the outermost peripheral part of a SOI layer is left in the form of an overhang after Ar annealing and a particle generation mechanism.

Hereinafter, what causes the outermost peripheral part of a SOI layer to be left in the form of an overhang by flattening heat treatment in an argon gas-containing atmosphere will be described with reference to FIG. 2.

When a bonded SOI wafer is produced by the ion implantation delamination method, in order to enhance the bonding strength at the bonding interface between a SOI layer 11 after delamination and a base wafer 12, bonding heat treatment is sometimes performed in an oxidizing atmosphere. By this bonding heat treatment, a surface oxide film 13 by the bonding heat treatment is formed on the surface of the SOI layer 11 after delamination (FIG. 2(a)). Then, the surface oxide film 13 formed by the bonding heat treatment is removed by using hydrofluoric acid, for example (FIG. 2(b)). By this oxide film formation and oxide film removal, it is possible to remove implantation damage caused at the time of ion implantation and left on the delaminated surface. In doing so, erosion by the hydrofluoric acid occurs at an interface 15 between the SOI layer 11/a BOX layer 14.

Then, in order to flatten the delaminated surface, high-temperature heat treatment (Ar annealing) is performed on the bonded SOI wafer, from which the surface oxide film 13 was removed, in an argon-containing atmosphere (FIG. 2(c)). This high-temperature Ar annealing causes migration in silicon atoms on the surface of the SOI layer 11, whereby the surface of the SOI layer 11 is flattened and, at the same time, erosion of the interface progresses as a result of SiO vaporizing at a Si/SiO$_2$ interface (the SOI/BOX interface 15 and a BOX/base wafer interface 16) (Si+SiO$_2$→2SiO). As a result, a state in which a thin film (SOI+BOX) has widely exfoliated is created and the outermost peripheral part of the SOI layer 11 is left in the form of an overhang.

After Ar annealing, sacrificial oxidation treatment (formation of a sacrificial oxide film 17 (FIG. 2(d))+oxide film removal (FIG. 2(e))) for adjusting the film thickness of the SOI layer is performed. If the film thickness of this formed sacrificial oxide film 17 is an insufficient thickness, the outer peripheral part of the SOI layer is thinly left in the form of an overhang after oxide film removal, which causes the thin outer peripheral part of the SOI layer to exfoliate in subsequent processes such as cleaning and become a particle.

Regarding this, the inventor of the present invention has found that, if the thickness of a BOX layer becomes 500 nm or more, a thin film (SOI+BOX) exfoliates noticeably, a wider overhang shape is formed, and the generation of particles also becomes noticeable. Then, the inventor of the present invention has found that, for a bonded SOI wafer with a BOX layer whose thickness is 500 nm or more, by adjusting a sacrificial oxide film thickness in sacrificial oxidation after Ar annealing so that the overhang-shaped outer peripheral part of a SOI layer completely changes into an oxide film, it is possible to prevent the generation of particles from the outermost peripheral part, which is left in the form of an overhang, of the SOI layer.

Figure 1:
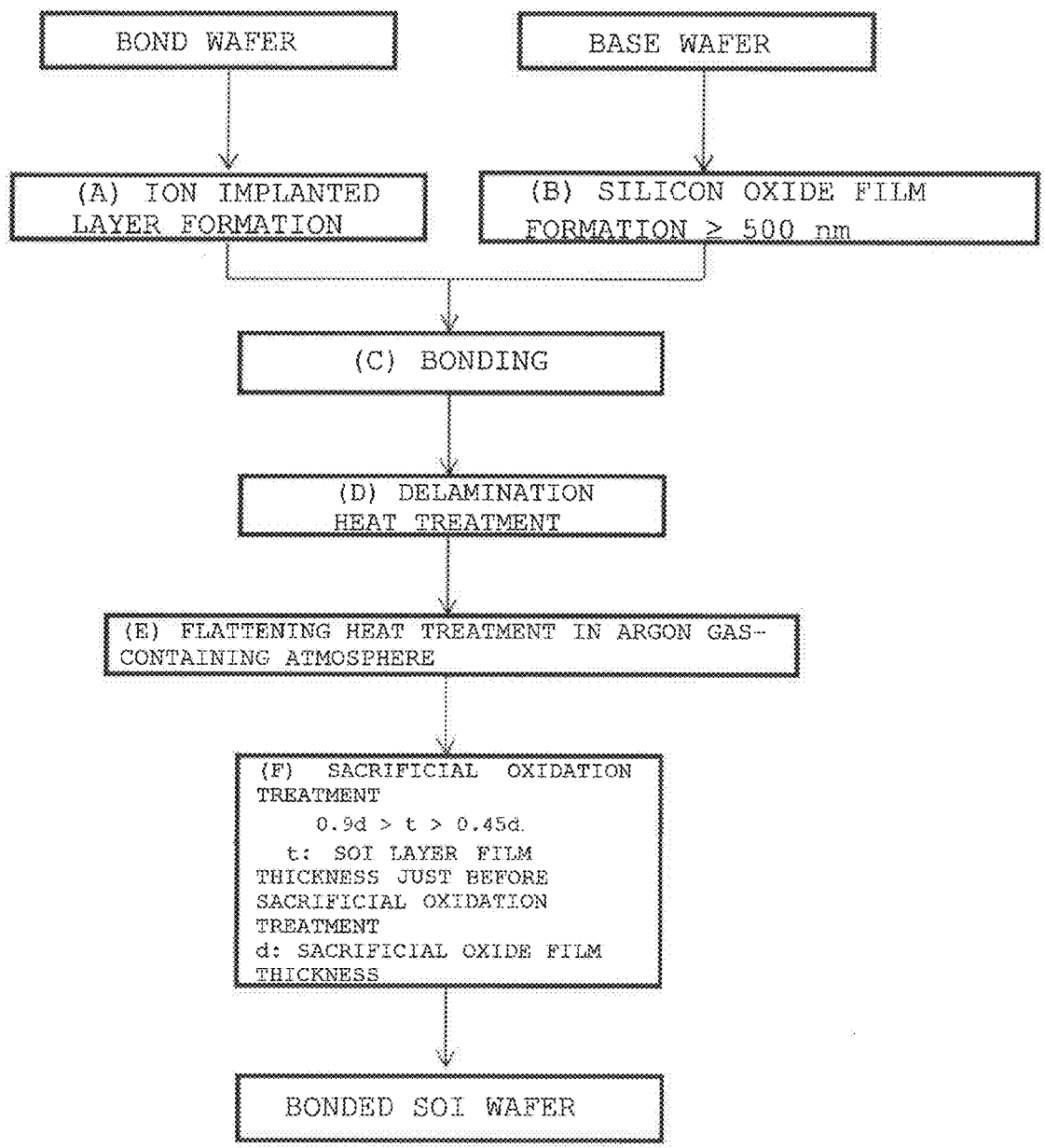
FIG. 1 is a process flow diagram showing an example of a method for producing a bonded SOI wafer of the present invention.
Figure 3:
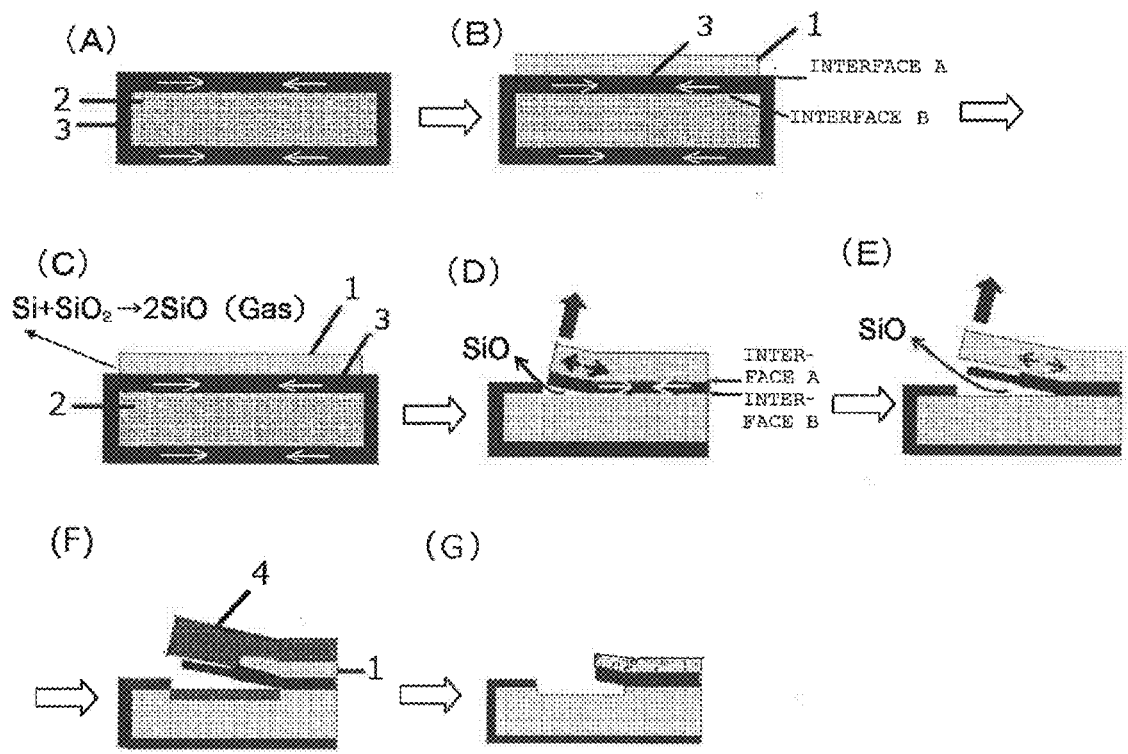
FIG. 3 is an explanatory diagram depicting an example of the method for producing a bonded SOI wafer of the present invention.

FIG. 1 illustrates a process flow diagram showing an example of a method for producing a bonded SOI wafer of the present invention. Moreover, FIG. 3 illustrates an explanatory diagram depicting an example of the method for producing a bonded SOI wafer of the present invention.

First, by implanting at least one type of gas ion of a hydrogen ion and a rare gas ion from the surface of a bond wafer formed of a silicon single crystal, an ion implanted layer is formed at a predetermined depth of the bond wafer (FIG. 1(A)).

Then, a silicon oxide film, which becomes a BOX layer (with a film thickness of 500 nm or more) later, is formed on the bond wafer and/or a base wafer. If such a thick oxide film is formed on the bond wafer, it is necessary to make an acceleration voltage for ion implantation extremely high, which requires an ion implantation apparatus that can perform high-voltage ion implantation. For this reason, in the present invention, it is preferable to form a silicon oxide film which is 500 nm or more on the base wafer (FIG. 1(B)). It goes without saying that a silicon oxide film may be formed on both the bond wafer and the base wafer in such a way that the total thickness of the silicon oxide films becomes 500 nm or more.

Then, the base wafer on which the silicon oxide film is formed and the ion implanted surface of the bond wafer are bonded together (FIG. 1(C)). This bonding is performed as follows: by making the bond wafer and the base wafer come into contact with each other in a clean atmosphere at room temperature, for example, the wafers are bonded together without use of an adhesive or the like.

Then, by delaminating the bond wafer at the ion implanted layer by performing delamination heat treatment, a bonded SOI wafer having, on the base wafer, a buried oxide film layer (a BOX layer) whose film thickness is 500 nm or more and a SOI layer is fabricated (FIG. 1(D)). As this delamination heat treatment, for example, by performing heat treatment in an inert gas atmosphere such as Ar at usually 400° C. or higher and 700° C. or lower for 30 minutes or more, the bond wafer can be delaminated at the ion implanted layer. Moreover, by performing plasma processing in advance on the surface to be bonded, the bond wafer can also be delaminated by applying an external force without performing heat treatment (or after performing heat treatment at a temperature at which delamination does not occur). It is to be noted that an upper limit of the film thickness of the buried oxide film layer can be set at 5 μm, for example.

Then, in order to enhance the bonding strength at the bonding interface between the SOT layer and the base wafer after delamination, bonding heat treatment in an oxidizing atmosphere may be performed and then processing to remove the formed surface oxide film may be performed. By this oxide film formation and oxide film removal, it is possible to remove implantation damage caused at the time of ion implantation and left on the delaminated surface.

Then, flattening heat treatment is performed on the bonded SOI wafer thus fabricated in an argon gas-containing atmosphere. At this time, in the bonded SOT wafer, at each of the interface between the SOI layer and the BOX layer and the interface between the BOX layer and the base wafer, a Si/SiO$_2$ interface is present.

For instance, as described earlier, when a thermal oxide film 3 is formed on a base wafer 2 (FIG. 3(A)), the base wafer 2 is bonded to a bond wafer having no oxide film, and a bonded SOI wafer is fabricated by the ion implantation delamination method (FIG. 3(B)), an interface A between a SOI layer 1 and a BOX layer 3 is a bonding interface and an interface B between the BOX layer 3 and the base wafer 2 is a thermal oxide film interface. In this case, as depicted in FIG. 3(C), compressive strain is kept in the thermal oxide film 3 (the BOX layer) formed on the base wafer 2. Thus, once the interface B is cut by a vaporization reaction of SiO (Si+SiO$_2$→2SiO), an internal stress in the BOX layer 3 is released and a force is applied in a direction in which a thin film (SOI+BOX) exfoliates, which promotes exfoliation (FIGS. 3(D) and (E)).

Since the internal stress in the BOX layer 3 increases with an increase in the thickness of the BOX layer 3, the thicker the thickness of the BOX layer 3, the more easily exfoliation is promoted. And, if the thickness of the BOX layer 3 is 500 nm or more as in the present invention, the thin film (SOI+BOX) exfoliates noticeably and a wider overhang shape is formed.

Moreover, such a phenomenon occurs in an argon-containing atmosphere (for example, a mixed gas atmosphere of argon and hydrogen or a 100% Ar gas atmosphere) and, in particular, occurs noticeably by heat treatment which is performed in a 100% Ar gas atmosphere for a long time (30 minutes or more) at a high temperature of 1150° C. or higher.

Figure 4:
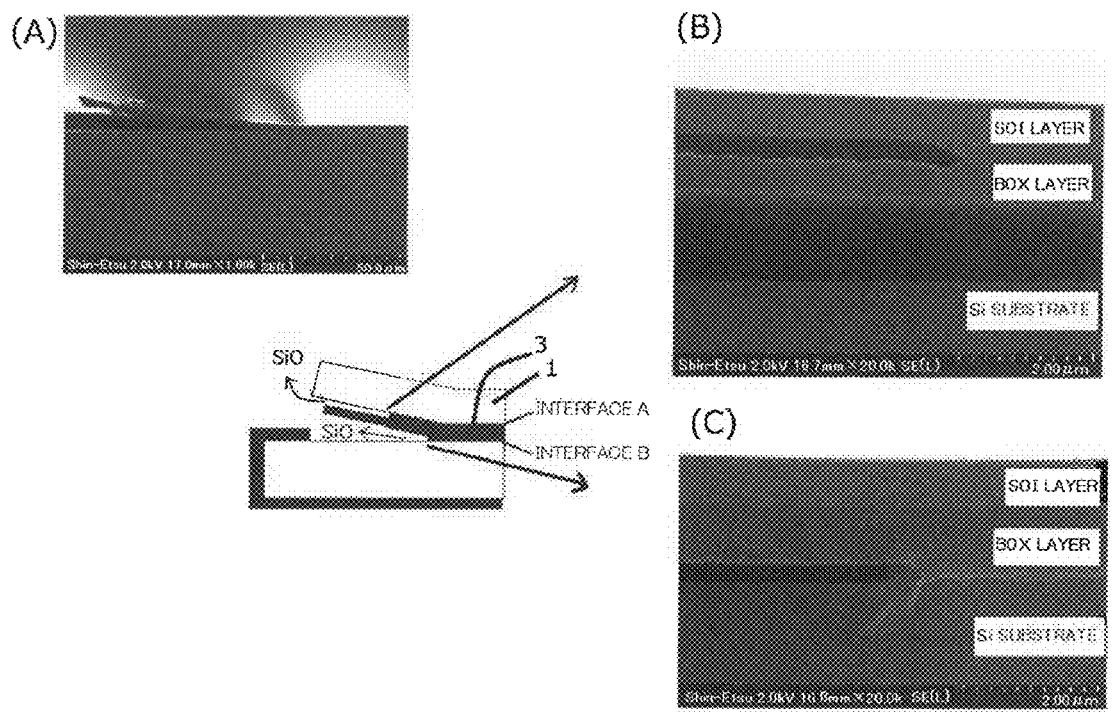
FIG. 4 shows (A) a SEM image of a bonded SOI wafer in a state in which a thin film (SOI+BOX) has widely exfoliated, (B) a SEM image of the state in which erosion at the SOI/BOX interface has progressed, and (C) a SEM image of the state in which erosion at the BOX/base wafer interface has progressed.

A SEM image of a bonded SOI wafer in a state in which, when Ar annealing is performed on a bonded wafer having a BOX layer 3: a film thickness of 1000 nm and a SOI layer 1: a film thickness of 750 nm, a thin film (SOI+BOX) has widely exfoliated is shown in FIG. 4(A). Moreover, a SEM image of the state in which erosion has progressed at a SOI/BOX interface A is shown in FIG. 4(B), and a SEM image of the state in which erosion has progressed at a BOX/base wafer interface B is shown in FIG. 4(C).

Then, sacrificial oxidation treatment (formation of a sacrificial oxide film 4+oxide film removal) which adjusts the film thickness of the SOI layer 1 is performed (FIG. 1(F), FIG. 3(F), and FIG. 3(G)).

Here, in the present invention, a sacrificial oxide film thickness is adjusted by adjusting the sacrificial oxidation conditions so that the overhang-shaped outer peripheral part of the SOI layer 1 completely changes into the sacrificial oxide film 4.

Figure 5:
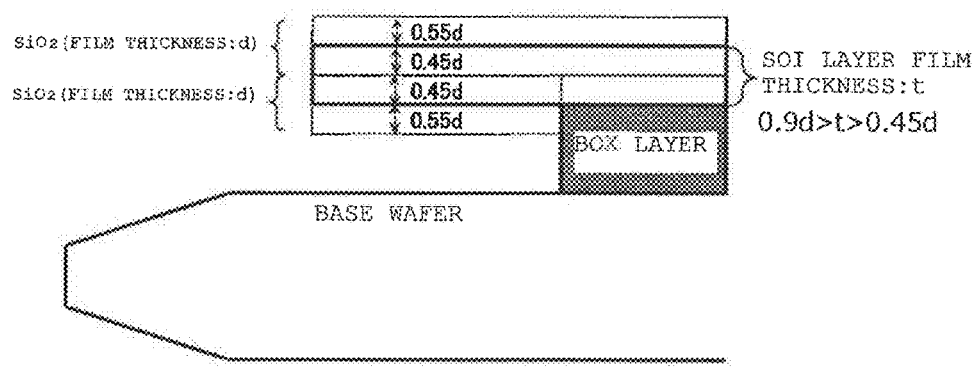
FIG. 5 is an explanatory diagram depicting the relationship between the film thickness (t) of a SOI layer on which a sacrificial oxidation treatment is to be performed and the film thickness (d) of a sacrificial oxide film which is formed by sacrificial oxidation treatment in the present invention.

Specifically, as depicted in FIG. 5, since, in an overhang-shaped portion of a SOI layer, a thermal oxide film is formed on the upper and lower surfaces thereof at the same time, in order to change the overhang-shaped portion of the SOI layer with a film thickness (t) completely into an oxide film, it is necessary to adjust a sacrificial oxide film thickness (d) in such a way that the relationship with the sacrificial oxide film thickness (d), which is formed on one surface, satisfies 2×0.45d>t.

On the other hand, since a sacrificial oxide film is formed only on the surface of the SOI layer other than the overhang-shaped portion thereof, t>0.45d has to be satisfied in order to allow the SOI layer to remain after sacrificial oxidation.

Therefore, by adjusting the sacrificial oxidation conditions (such as an oxidation temperature and an oxidation time) for forming the sacrificial oxide film thickness (d) in such a way that 0.9d>t>0.45d is satisfied, it is possible to suppress the generation of particles caused by an overhang-shaped portion of a SOI layer.

Incidentally, the conditions for sacrificial oxidation heat treatment are not limited to particular conditions as long as the conditions that a sacrificial oxide film whose film thickness satisfies 0.9d>t>0.45d can be formed; for example, by performing sacrificial oxidation heat treatment at a temperature of about 900 to 950° C., it is possible to enhance the bonding interface bond strength while sufficiently removing damage on a delaminated surface (a SOI layer surface) without the generation of oxidation-induced stacking faults (OSFs).

Then, the sacrificial oxide film formed by the sacrificial oxidation treatment is removed (FIG. 3(G)). As a result, the outer peripheral part, which is left in the form of an overhang after Ar annealing, of the SOI layer is completely removed. As an oxide film removal method, there is a method by which, for example, 15% HF cleaning and, if necessary, RCA cleaning are performed.

With such a method for producing a bonded SOI wafer of the present invention, by adjusting a sacrificial oxide film thickness in sacrificial oxidation treatment after Ar annealing so that the overhang-shaped outermost peripheral part of a SOI layer completely changes into an oxide film, it is possible to prevent the generation of particles from the outermost peripheral part, which is left in the form of an overhang after Ar annealing, of the SOI layer.

Moreover, in the present invention, by additionally forming an epitaxial layer on the surface of the SOI layer subjected to the sacrificial oxidation treatment, it is also possible to obtain a bonded SOI wafer with a relatively large SOI layer film thickness.

In this case, if an oxide film remains on the base wafer surface in an outer peripheral terrace portion of the SOI wafer on which epitaxial growth is to be performed, it is preferable to remove this oxide film and then perform epitaxial growth; by a process of removing the oxide film in the terrace portion or oxide film removal in a sacrificial oxidation treatment process performed before the above process, the BOX layer is etched to an area slightly closer to the inside than the SOI layer, which results in a structure in which the end face of the BOX layer is recessed from the end face of the SOI layer.

As a result, it is possible to prevent polysilicon growth which occurs if epitaxial growth is performed in a state in which the outer peripheral part of the BOX layer protrudes from the end face of the SOI layer (that is, a state in which the outermost peripheral part of the BOX layer is exposed) or generation of defects such as steps (valley-shaped steps which are generated between an epitaxial layer grown from the end face of the SOI layer and an epitaxial layer grown from the terrace portion).

EXAMPLES

Hereinafter, the present invention will be described more specifically with Example and Comparative Example, but the present invention is not limited to these examples.

Under the production conditions of Table 1 given below, by bonding together a bond wafer subjected to ion implantation and a base wafer with a silicon oxide film having a film thickness of 600 nm and delaminating the bond wafer at the ion implanted layer, a bonded SOI wafer was fabricated. Then, bonding heat treatment was performed and the oxide film formed by the bonding heat treatment was removed, and flattening heat treatment was then performed in a 100% Ar gas atmosphere. SOI film thicknesses after Ar annealing were 490 nm (Example) and 415 nm (Comparative Example).

At this time, it was confirmed that, by SEM observation, in both the SOI wafer of Example and the SOI wafer of Comparative Example, an overhang shape depicted in the diagram of FIG. 3(E) was left shortly after the Ar annealing.

Then, after sacrificial oxidation treatment (sacrificial oxide film formation+oxide film removal) for adjusting the SOI layer was performed under the respective conditions listed in Table 1, SC1 cleaning (80° C., 3 minutes) was performed in separate cleaning tanks and drying was then performed, and particles (with a diameter of 0.25 μm or more) adhering to the surface were measured by using a particle counter (SP2 manufactured by KLA-Tencor Corporation).

TABLE 1

|  | (Example) | (Comparative Example) |
|---|---|---|
| Bond wafer | 300 mm φ, <100>, without an oxide film | |
| Base wafer | 300 mm φ, <100>, with an 600-nm oxide film | |
| Ion implantation conditions | H⁺, 65 keV, $7 \times 10^{16}/cm^2$ | H⁺, 55 keV, $6.5 \times 10^{16}/cm^2$ |
| Delamination heat treatment conditions | 500° C., 30 minutes, nitrogen atmosphere | |
| Bonding heat treatment conditions | Pyrogenic oxidation, 950° C. | |
| Oxide film removal | 20% HF | |
| Flattening heat treatment conditions | Ar 100%, 1200° C., 60 minutes | |
| SOI layer film thickness (t) | 490 nm | 415 nm |
| Sacrificial oxidation conditions | Pyrogenic oxidation, 950° C. | Pyrogenic oxidation, 950° C. |
| Sacrificial oxide film thickness (d) | 589 nm | 422 nm |
| 0.9d > t > 0.45d | Satisfied | Not satisfied |
| Oxide film removal | 20% HF | |
| LPDs after SC1 cleaning | 7 LPDs/wafer | 75 LPDs/wafer |

As a result, in Example, the effect of greatly reducing the generation of particles in a cleaning process after sacrificial oxidation treatment as compared to Comparative Example could be obtained.

It is to be understood that the present invention is not limited in any way by the embodiment thereof described above. The above embodiment is merely an example, and anything that has substantially the same structure as the technical idea recited in the claims of the present invention and that offers similar workings and benefits falls within the technical scope of the present invention.

The invention claimed is:

1. A method for producing a bonded SOI wafer, by forming an ion implanted layer by implanting at least one type of gas ion of a hydrogen ion and a rare gas ion from a surface of a bond wafer formed of a silicon single crystal and, after bonding together the ion implanted surface of the bond wafer and a surface of a base wafer formed of a silicon single crystal with a silicon oxide film placed therebetween, delaminating the bond wafer at the ion implanted layer to fabricate a bonded SOI wafer having a BOX layer and a SOI layer on a base wafer and, after performing flattening heat treatment on the bonded SOI wafer in an argon gas-containing atmosphere, sacrificial oxidation treatment that adjusts a film thickness of the SOI layer is performed, wherein a film thickness of the BOX layer in the bonded SOI wafer fabricated by the delamination is set so as to be 500 nm or more, and a sacrificial oxide film is formed in such a way that a relationship between a film thickness (t) of the SOI layer on which the sacrificial oxidation treatment is to be performed and a film thickness (d) of the sacrificial oxide film which is formed by the sacrificial oxidation treatment satisfies 0.9d>t>0.45d.

2. The method for producing a bonded SOI wafer according to claim 1, wherein the argon gas-containing atmosphere is 100% Ar gas.

3. The method for producing a bonded SOI wafer according to claim 2, wherein
by forming a silicon oxide film which is 500 nm or more on the base wafer and, after bonding together the base wafer on which the silicon oxide film is formed and the ion implanted surface of the bond wafer, delaminating the bond wafer at the ion implanted layer, the bonded SOI wafer with the BOX layer whose film thickness is 500 nm or more is fabricated.

4. The method for producing a bonded SOI wafer according to claim 3, wherein
an epitaxial layer is formed on a surface of the SOI layer subjected to the sacrificial oxidation treatment.

5. The method for producing a bonded SOI wafer according to claim 2, wherein
an epitaxial layer is formed on a surface of the SOI layer subjected to the sacrificial oxidation treatment.

6. The method for producing a bonded SOI wafer according to claim 1, wherein
by forming a silicon oxide film which is 500 nm or more on the base wafer and, after bonding together the base wafer on which the silicon oxide film is formed and the ion implanted surface of the bond wafer, delaminating the bond wafer at the ion implanted layer, the bonded SOI wafer with the BOX layer whose film thickness is 500 nm or more is fabricated.

7. The method for producing a bonded SOI wafer according to claim 6, wherein
an epitaxial layer is formed on a surface of the SOI layer subjected to the sacrificial oxidation treatment.

8. The method for producing a bonded SOI wafer according to claim 1, wherein
an epitaxial layer is formed on a surface of the SOI layer subjected to the sacrificial oxidation treatment.

* * * * *